(12) United States Patent
Lee et al.

(10) Patent No.: US 8,030,751 B2
(45) Date of Patent: Oct. 4, 2011

(54) BOARD-ON-CHIP TYPE SUBSTRATES WITH CONDUCTIVE TRACES IN MULTIPLE PLANES AND SEMICONDUCTOR DEVICE PACKAGES INCLUDING SUCH SUBSTRATES

(75) Inventors: Choon Kuan Lee, Singapore (SG); David J. Corisis, Nampa, ID (US); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 12/106,845

(22) Filed: Apr. 21, 2008

(65) Prior Publication Data
US 2009/0218677 A1     Sep. 3, 2009

(30) Foreign Application Priority Data
Mar. 3, 2008   (SG) .............................. 200801773-3

(51) Int. Cl.
  *H01L 23/04* (2006.01)
(52) U.S. Cl. ........................ 257/698; 257/701
(58) Field of Classification Search .................. 257/786, 257/701, 698, 784
See application file for complete search history.

(56) References Cited

U.S. PATENT DOCUMENTS

| | | |
|---|---|---|
| 4,434,321 A | 2/1984 | Betts |
| 4,613,891 A | 9/1986 | Ng et al. |
| 4,700,473 A | 10/1987 | Freyman et al. |
| 5,404,045 A | 4/1995 | Mizushima |
| 5,790,386 A | 8/1998 | Magee |
| 6,091,027 A | 7/2000 | Hesselbom et al. |
| 6,528,348 B2 | 3/2003 | Ando et al. |
| 6,532,651 B1 | 3/2003 | Andou et al. |
| 6,707,140 B1 | 3/2004 | Nguyen et al. |
| 6,710,246 B1 | 3/2004 | Mostafazadeh et al. |
| 7,015,587 B1 | 3/2006 | Poddar |

(Continued)

FOREIGN PATENT DOCUMENTS

EP    0818752 A2    1/1998

OTHER PUBLICATIONS

Form APO/SG/210—Australian Patent Office Search Report dated Jun. 2, 2009, four (4) pages.

*Primary Examiner* — S. V Clark
(74) *Attorney, Agent, or Firm* — TraskBritt

(57) ABSTRACT

A method for fabricating a chip-scale board-on-chip substrate, or redistribution element, includes forming conductive planes on opposite sides of a substrate. A first of the conductive planes includes two sets of bond fingers, conductive traces that extend from a first set of the bond fingers, and two sets of redistributed bond pads, including a first set to which the conductive traces lead. The second conductive plane includes conductive traces that extend from locations that are opposite from the second set of bond fingers toward locations that are opposite from the locations of the second set of redistributed bond pads. Conductive vias are formed through the second set of bond fingers to the conductive traces of the second conductive plane. In addition, conductive vias are also formed to electrically connect the conductive vias of the second conductive plane to their corresponding redistributed bond pads in the first conductive plane. Redistribution elements including these features, as well as semiconductor device assemblies including the redistribution elements and assembly methods, are also disclosed.

17 Claims, 2 Drawing Sheets

U.S. PATENT DOCUMENTS

| | | |
|---|---|---|
| 7,030,317 B1 | 4/2006 | Oman |
| 7,045,396 B2 | 5/2006 | Crowley et al. |
| 7,420,270 B2 * | 9/2008 | Lee et al. ............... 257/691 |
| 7,683,741 B2 * | 3/2010 | Ito et al. ............... 333/187 |
| 7,816,777 B2 * | 10/2010 | Minamio et al. ............ 257/688 |
| 2003/0155638 A1 | 8/2003 | Ito |
| 2004/0020690 A1 | 2/2004 | Parker, Jr. et al. |
| 2004/0211589 A1 | 10/2004 | Chou et al. |
| 2007/0246811 A1 | 10/2007 | Tsai et al. |

* cited by examiner

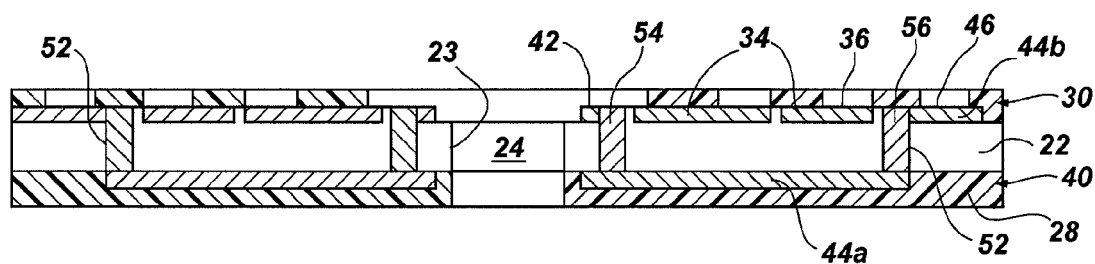
FIG. 2A
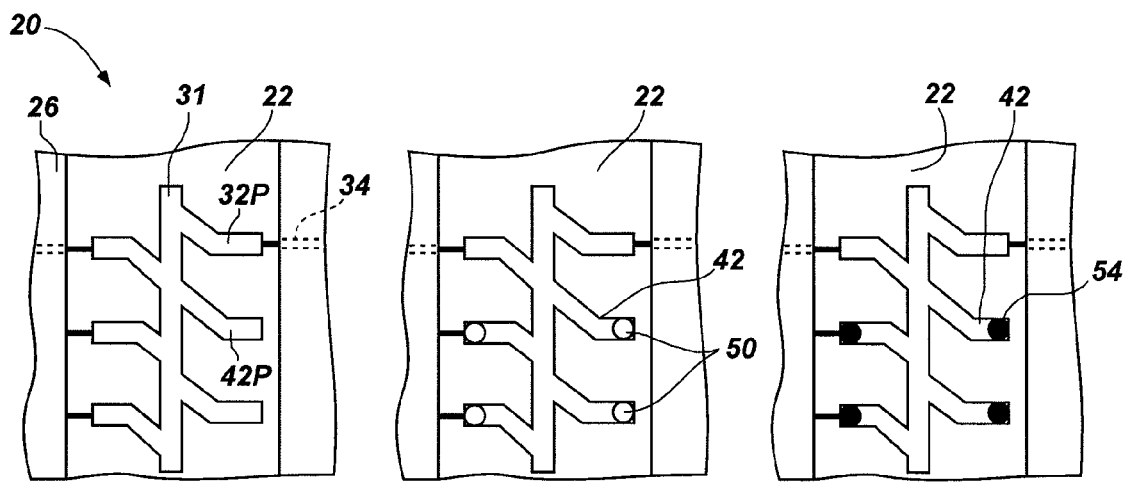
FIG. 4  FIG. 5  FIG. 6
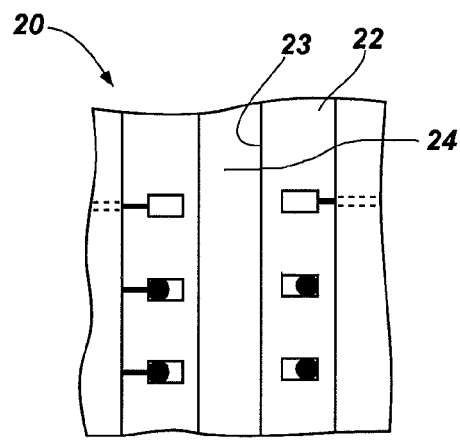
FIG. 7

US 8,030,751 B2

BOARD-ON-CHIP TYPE SUBSTRATES WITH CONDUCTIVE TRACES IN MULTIPLE PLANES AND SEMICONDUCTOR DEVICE PACKAGES INCLUDING SUCH SUBSTRATES

TECHNICAL FIELD

The present invention relates generally to substrates for chip-scale packages and, more specifically, to substrates with relaxed circuit design rules. In particular, the embodiments of the present invention relate to chip-scale "board-on-chip" (BOC), substrates with conductive traces located in two or more conductive planes, as well as to methods for designing and fabricating such substrates, to packaging methods, and to packages including the substrates.

BACKGROUND

Printed circuit boards in the for, of so-called "interposer substrates" have long been used as a primary medium for rerouting connection patterns of semiconductor devices, including in chip-scale packages (CSPs) for connection to higher-level packaging. The use of printed circuit boards is desirable since the processes for manufacturing them are well developed, inexpensive, and provide high yields. In addition, processes for packaging semiconductor devices with printed circuit boards have been refined over several decades of use. Further, printed circuit boards are themselves very reliable (i.e., they have low operational failure rates).

Due to the ever-increasing device densities and speeds of state-of-the-art semiconductor devices, the number of bond pads on semiconductor devices also continue to increase. The overall dimensions of state-of-the-art semiconductor devices do not typically increase, however. The dimensions of the circuit board interposer substrates that are used in packaging such devices, particularly in chip-scale packages, are likewise limited. Consequently, an ever-increasing number of conductive traces and terminals must be arranged within the relatively fixed area of a printed circuit board interposer substrate.

Until recently, increases in the numbers of conductive traces and terminals could be accommodated despite restrictions on the dimensions and areas of printed circuit board interposer substrates. As circuit design rules have approached the so-called "40/40" limit in which conductive traces have minimum widths of 40 μm and must be spaced at least 40 μm from each other and from other conductive structures, undesirable electrical issues, such as inductance between power and ground signals, have arisen. It is apparent that these problems would be magnified with even tighter design rules (i.e., conductive traces with widths of less than 40 μm that are closer than 40 μm to one another and to other conductive structures).

Accordingly, there are needs for interposer substrate design and manufacture processes, as well as for interposer substrates, that accommodate increased numbers of circuits without further tightened design rules.

BRIEF DESCRIPTION OF THE DRAWINGS

In the drawings:

FIG. 2A is a cross-sectional representation of another embodiment of a redistribution element;

FIGS. 4 through 7 depict an embodiment of a process for fabricating a chip-scale, board-on-chip substrate with at least two conductive planes.

DETAILED DESCRIPTION

Figure 1:
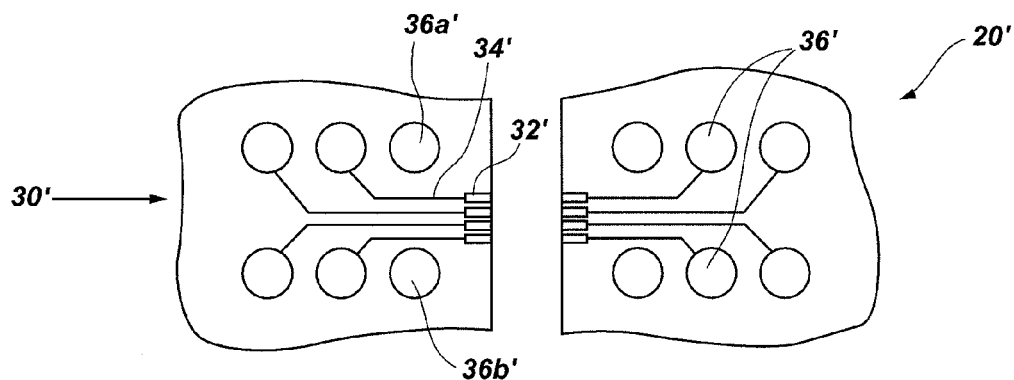
FIGS. 1 and 1A respectively show partial top and cross-sectional views of a portion of a conductive plane of a conventionally configured interposer substrate for a chip-scale, board-on-chip package.
Figure 1A:
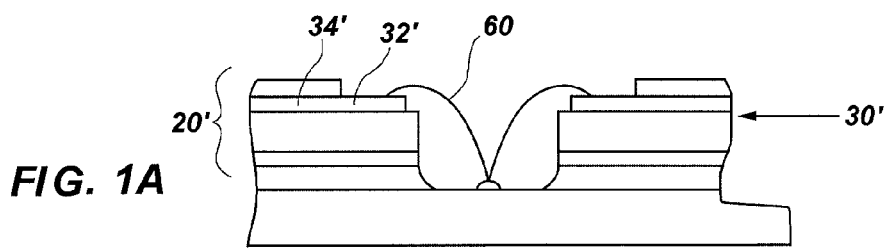

FIGS. 1 and 1A illustrate a portion of a state-of-the-art board-on-chip substrate 20', which includes only one conductive plane 30'. Conductive plane 30' includes connection pads 32' and conductive traces 34' that extend laterally from connection pads 32' to terminals 36', to which solder balls or other discrete conductive structures (not shown) may be secured. As shown, four conductive traces 34' extend between a first pair of terminals 36a' and 36b'. With a 40/40 design rule, which is the current state of the art, terminals 36a' and 36b' must be spaced at least 360 μm apart from one another, which may be an undesirably large distance when restrictions on the area of substrate 20' are considered in view of the large number of terminals that substrate 20' must carry. A tighter design rule (i.e., thinner, more closely spaced conductive traces) would undesirably generate additional inductance and would also likely result in decreased product yields.

Figure 2:
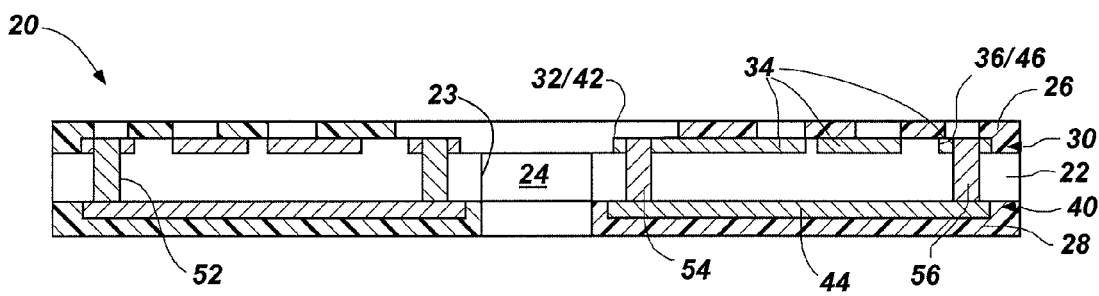
FIG. 2 is a cross-sectional representation of an embodiment of a chip-scale, board-on-chip interposer substrate, or "redistribution element," of the present invention, with at least two conductive planes that include conductive traces.

The present invention includes an approach to accommodating additional circuit traces and their corresponding terminals, or pads, without tightening design rules. An embodiment of a chip-scale, board-on-chip substrate that incorporates teachings of the present invention is shown in FIGS. 2 and 2A. For the sake of simplicity, the chip-scale, board-on-chip interposer substrate may be more generically referred to herein as a "redistribution element 20." As used herein, the term "chip-scale" includes redistribution elements 20 that have dimensions that are about the same as or only slightly (e.g., up to 20%) larger than corresponding dimensions of the semiconductor device 10 (FIG. 3) with which the redistribution elements 20 are assembled. In various embodiments, a redistribution element according to the present invention may have state-of-the-art design rules (e.g., 40/40, in which conductive traces have maximum widths of 40 μm and are spaced a maximum of 40 μm apart from other conductive structures) or relaxed design rules (e.g., design rules that are greater than 40/40, or that allow for conductive trace widths and spacing that exceed 40 μm).

Redistribution element 20 includes a substrate 22 that is positioned between two conductive planes 30 and 40 and that electrically isolates overlapping portions of various elements (e.g., conductive traces, contact pads or terminals, etc.) within conductive planes 30 and 40 from one another. In addition, redistribution element 20 includes insulation layers 26 and 28, which may comprise known surface mount (S/M) materials, over conductive planes 30 and 40, respectively. In some embodiments, redistribution element 20 includes an opening 24, such as the depicted, elongate slot, that extends through the thickness of substrate 22. Opening 24 may be defined by at least one interior peripheral edge 23 of substrate 22.

Figure 3:
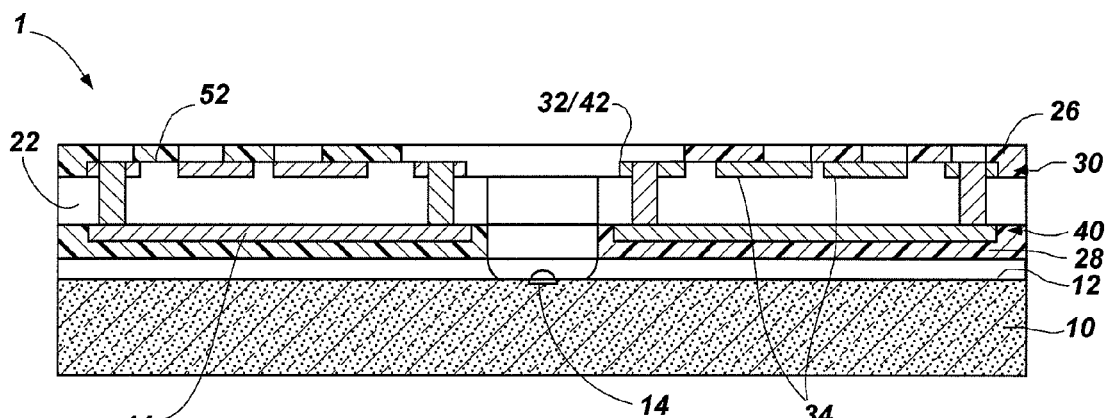
FIG. 3 shows an embodiment of a semiconductor device package that includes an embodiment of a chip-scale, chip-on-board substrate that incorporates teachings of the present invention.

Turning now to FIG. 3, insulation layer 28 is configured to be positioned adjacent to a bond pad-bearing surface 12 of a complementarily configured semiconductor device 10, while insulation layer 26 is configured to be located at the exterior of a chip-scale package 1 that is formed when redistribution element 20 is assembled with semiconductor device 10.

As shown, conductive plane 30 is located closest to the exterior of chip-scale package 1. Accordingly, conductive plane 30 is also referred to herein as an "outer conductive plane." Conductive plane 30 includes a plurality of intermediate connection pads 32 and 42, or "bond fingers." Upon disposal of redistribution element 20 upon surface 12 of semiconductor device 10, intermediate connection pads 32 and 42 are positioned laterally proximate to corresponding bond pads 14 of semiconductor device 10. In the depicted embodiment, intermediate connection pads 32 and 42 are positioned adjacent to interior peripheral edge 23 of substrate 22.

With continued reference to FIGS. 2 through 3, in addition to intermediate connection pads 32 and 42, conductive plane 30 includes conductive traces 34 that extend laterally from intermediate connection pads 32 to redistributed bond pads 36, which are also in conductive plane 30. Conductive plane 30 also includes redistributed bond pads 46 that correspond to intermediate connection pads 42.

The lower, or base, conductive plane 40 includes all or part of conductive traces 44 that correspond to connection pads 42 and redistributed bond pads 46. By including conductive traces 44 or portions thereof in a second conductive plane 40, conductive traces 34 of conductive plane 30 may be wider and/or spaced further distances apart from one another than the conductive traces 34' of existing board-on-chip substrates 20'. Increased spacing between conductive traces 34, 44 reduces inductance and decreases interference between adjacent electrical paths (i.e., between adjacent conductive traces 34 or 44). In some embodiments, conductive traces 44 provide routes for power ($V_{ss}$) and ground ($V_{dd}$) that are carried primarily by a separate conductive plane 40 than that (conductive plane 30) which carries signals.

In the embodiment shown in FIG. 2A, portions 44a of the conductive traces 44 (FIG. 2) that connect intermediate connection pads 42 to their corresponding redistributed bond pads 46 may extend along conductive plane 40. In these embodiments, conductive traces 44 may also include portions 44b that are also located in, or extend along, conductive plane 30 to corresponding redistributed bond pads 46. In other embodiments, as shown in FIG. 2, an entire conductive trace 44 may be located in, or extend along, conductive plane 40. Of course, a redistribution element 20 according to the present invention may include a combination of these embodiments of conductive element portions 44a/44b and conductive traces 44.

Each intermediate connection pad 42 in conductive plane 30 communicates with its corresponding conductive trace 44, or portion 44a thereof, in conductive plane 40 by way of a conductive via 54. In the illustrated embodiments, each conductive via 54 extends through an intermediate connection pad 42 to portion 44a of conductive trace 44 at an opposite location on substrate 22.

Each conductive trace 44 (FIG. 2), or portion 44a thereof (FIG. 2A), in conductive plane 40 communicates with corresponding redistributed bond pads 46 in conductive plane 30 by way of a conductive via 56 that extends from conductive plane 40, through substrate 22, and to conductive plane 30. More specifically, each conductive via 56 extends directly to a corresponding redistributed bond pad 46, as shown in FIG. 2, or to a portion 44b of conductive trace 44 that extends laterally across conductive plane 30 to the corresponding redistributed bond pad 46, as illustrated by FIG. 2A.

In some embodiments, connection pads 32, 42 and redistribution pads 36, 46 may have dimensions (e.g., diameters, side lengths, etc.) of about 300 μm, about 200 μm, or less than about 200 μm. Conductive traces 34, 44, and portions 44a, 44b of some embodiments of redistribution element 20 may have widths of about 40 μm or greater, and may be spaced apart from one another and from other conductive features (e.g., redistribution pads 36, 46 and/or connection pads 32, 42) by a distance of at least about 40 μm.

Turning now to FIGS. 4 through 7, an embodiment of a method for fabricating a redistribution element 20 of the present invention is illustrated and described.

FIG. 4 depicts a partially fabricated redistribution element 20, which includes substrate 22 and conductive planes 30 and 40 (FIGS. 2 through 3) and features (e.g., interconnected connection pad predecessors 32P, 42P, conductive traces 34, 44 (FIGS. 2 through 3), redistribution pads 36, 46 (FIGS. 2 through 3), etc.), and insulation layers 26 and 28 (FIGS. 2 through 3).

Redistribution element 20 may be fabricated by processes that are known in the art. Redistribution element 20 may comprise a conventional circuit board structure, which may include a substrate or substrate element 22 formed from a resin, such as BT resin, FR-4, or the like. Alternatively, conventional interposer substrate material, which may include a substrate 22 formed from a dielectric-coated semiconductor material, a thin layer of a ceramic material or glass, or the like, may comprise substrate 22 of redistribution element 20. In other embodiments, substrate 22 may comprise a flexible (e.g., polyimide) film.

Conductive planes 30 and 40 (FIGS. 2 through 3) may also be fabricated by known processes. In some embodiments, a layer of conductive material may be formed both of the opposite major surfaces of substrate 22, then patterned by known processes (e.g., mask and etch techniques, etc.) to define the conductive features of conductive planes 30 and 40. In embodiments where substrate 22 comprises a resin or flexible film, conductive material (e.g., copper, aluminum, etc.) in the form of a thin foil may be applied and laminated to the major surfaces of substrate 22. In embodiments where substrate 22 comprises an interposer substrate material, the material of conductive planes 30 and 40 may be deposited onto the opposite major surfaces of substrate 22 (e.g., by physical vapor deposition (PVD) processes, such as sputtering; chemical vapor deposition (CVD) processes; etc.). Alternatively, conductive planes 30 and 40 may be fabricated by applying and laminating preformed, thin leads to the major surfaces of substrate 22. Known printing techniques may also be used to form conductive planes 30 and 40 with features that are defined during application of a conductive material to the major surfaces of substrate 22.

Once conductive planes 30 and 40 with defined features are present on opposite major surfaces of substrate 22, insulation layers 26 and 28 (insulation layer 28 is shown in FIGS. 2 through 3) may be formed or applied to conductive planes 30 and 40, respectively. In some embodiments, one or both insulation layers 26 and 28 may comprise a conventional surface mount (S/M) structure, such as an adhesive coated polyimide film. Insulation layer 26 may be applied or formed over conductive plane 30 in such a way that a central area of conductive plane 30, including an elongate bar 31 from which connection pad predecessors 32P and 42P extend, and underlying portions of a major surface of substrate 22 are exposed through insulation layer 26. Similarly, insulation layer 28 may be formed or applied in such a way that corresponding regions of the opposite side of substrate 22, as well as features of conductive plane 40 on those regions of the opposite side of substrate 22, are exposed.

As shown in FIG. 5, a via hole 50 is formed through each intermediate connection pad 42 and an underlying location of substrate 22. Via holes 50 extend down to, but not necessarily through, conductive traces 44 (FIG. 2) or portions 44a thereof (FIG. 2A) that correspond to each connection pad 42.

While via holes 50 are being formed through intermediate connection pads 42 and underlying portions of substrate 22, another set of via holes 52 (FIGS. 2 through 3) may be formed through portions 44b of conductive traces 44 that extend laterally from redistributed bond pads 46 (FIG. 2A) or through redistributed bond pads 46 (FIG. 2), as well as through portions of substrate 22 that underlie portions 44b or redistributed bond pads 46. Like via holes 50, via holes 52 may expose, but do not necessarily extend into, conductive traces 44.

Known processes may be used to form via holes 50 and 52. Such processes include, but are not limited to, mask and etch processes, laser drilling, mechanical drilling, and the like.

Once via holes 50 and 52 have been formed, conductive material may be introduced therein to form conductive vias 54 and 56 (conductive vias are shown in FIGS. 2 through 3), as illustrated in FIG. 6. In various embodiments, known processes, including, but not limited to, electroless plating techniques and immersion plating techniques, may be used to introduce conductive material into via holes 50 and 52.

The resulting conductive vias 54 enable electrical communication between connection pads 42, which are in the outer conductive plane 30 (FIGS. 2 through 3), and their corresponding conductive traces 44 (FIG. 2), or portions 44a thereof (FIG. 2A), in the base conductive plane 40 (FIGS. 2 through 3). Conductive vias 56 enable electric communication between conductive traces 44, 44a of the base conductive plane 40 and their corresponding redistributed bond pads 46 (FIG. 2) or conductive trace portions 44b (FIG. 2A) that are located in the upper conductive plane 30.

Turning to FIG. 7, in some embodiments, an opening 24, such as a slot, may be formed through substrate 22 of redistribution element 20. Known processes, including, but not limited to, mechanical routing techniques, die-punch techniques, mask and etch techniques, and the like, may be used to form opening 24. As opening 24 is formed, material may be removed from conductive plane 30 (e.g., from elongate bar 31 from which connection pad predecessors 32P and 42P extend and from pad predecessors 32P and 42P (FIG. 4)), from substrate 22, and from conductive plane 40 (e.g., from an elongate bar (not shown) from which conductive traces 44 extend). As material is removed from conductive plane 30, connection pads 32 and 42 may be defined.

With returned reference to FIG. 3, an embodiment of a process for assembling a redistribution element 20 with a semiconductor device 10 is described. Redistribution element 20 may be part of a larger structure (e.g., a sheet, strip, full or partial wafer, etc.) that includes a plurality of redistribution elements. Semiconductor device 10 may be a singulated semiconductor die, or a semiconductor die that remains part of a larger fabrication substrate (e.g., a full or partial wafer of semiconductor material, such as silicon, indium phosphide, gallium arsenide, etc.; a silicon-on-insulator (SOI) type substrate, such as silicon-on-ceramic (SOC), silicon-on-glass (SOG), silicon-on-sapphire (SOS); etc.) upon which a plurality of semiconductor devices have been fabricated and have not yet been cut, or singulated. While FIG. 3 depicts the assembly of a redistribution element 20 with an embodiment of semiconductor device 10 that includes bond pads 14 that are arranged along a center line of semiconductor device 10, other embodiments of redistribution elements 20 that incorporate teachings of the present invention may be configured for assembly with semiconductor devices with other arrangements of bond pads 14, or connection patterns, including, but not limited to, peripherally located bond pads, bond pads arranged in an area array over a surface of the semiconductor device, and the like.

Redistribution element 20 is aligned over semiconductor device 10 in such a way that bond pads 14 of semiconductor device 10 are exposed at locations that are laterally adjacent and proximate to corresponding connection elements 32, 42 of redistribution element 20. In the depicted embodiment, bond pads 14 are exposed through opening 24.

Redistribution element 20 may be adhered to surface 12 of semiconductor device 10 by any known, suitable technique. In some embodiments, an adhesive element 29 (not shown), such as a quantity of a suitable adhesive material or strip of material (e.g., polyimide, etc.) with adhesive material coating both major surfaces thereof, may secure insulation layer 28 of redistribution element 20 to surface 12 of semiconductor device 10. In other embodiments, an adhesive coating on an exposed surface of insulation layer 28 may secure redistribution element 20 to surface 12.

Once redistribution element 20 and semiconductor device 10 have been assembled and secured to one another, bond pads 14 of semiconductor device 10 that are exposed through opening 24 of redistribution element 20 may be electrically connected to corresponding connection pads 32, 42. More specifically, intermediate conductive elements 60 (FIG. 1A) may be formed or placed between bond pads 14 and their corresponding connection pads 32, 42. In some embodiments, intermediate conductive elements 60 may comprise bond wires that are formed by known wire bonding processes. In other embodiments, intermediate conductive elements 60 may comprise leads, which may be carried by a flexible dielectric film (e.g., as is used in tape-automated bonding (TAB) processes).

Additionally, an encapsulant material (e.g., a quantity of glob-top encapsulant material, a lower viscosity encapsulant material, etc.) may be introduced onto intermediate conductive elements 60 to protect the same and to complete the assembly of a chip-scale package 1 according to the present invention.

While FIG. 3 illustrates an embodiment in which connection pads 32, 42 of an outer conductive plane 30 are connected to bond pads 14 of a semiconductor device 10, other embodiments, including embodiments in which connection pads, or bond fingers, are part of a conductive plane located adjacent to a semiconductor device, may also be within the scope of the present invention.

Although the foregoing description contains many specifics, these should not be construed as limiting the scope of the present invention, but merely as providing illustrations of some embodiments. Similarly, other embodiments of the invention may be devised which do not exceed the scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A chip-scale substrate for use in redistributing a bond pad arrangement of a semiconductor device in a chip-on-board configuration, the chip-scale substrate comprising:
   a substrate element comprising at least one elongate slot extending through a central region of the substrate element, between a first surface and an opposite, second surface of the substrate element;

a first conductive plane carried on the first surface of the substrate element and comprising:
   at least one first conductive trace;
   at least one first bond finger continuous with the at least one first conductive trace; and
   at least one second bond finger;
a second conductive plane carried on the second surface of the substrate element and comprising:
   at least one second conductive trace; and
at least one conductive via extending through and communicating with the at least one second bond finger, extending through the substrate element, and contacting the at least one second conductive trace.

2. The substrate of claim 1, wherein the at least one first bond finger and the at least one second bond finger are positioned adjacent to an edge portion of the substrate element forming a portion of the at least one elongate slot.

3. The substrate of claim 2, wherein the at least one first bond finger and the at least one second bond finger respectively comprise a plurality of first bond fingers and a plurality of second bond fingers.

4. The substrate of claim 2, further comprising:
   at least another conductive via extending from the at least one second conductive trace, through the substrate element, and to a terminal carried by the first surface of the substrate element.

5. The substrate of claim 4, wherein the at least one conductive via extends through the substrate element at a location proximate to the at least one elongate slot and the at least another conductive via extends through the substrate element at a more distant location from the at least one elongate slot.

6. The substrate of claim 5, wherein the at least another conductive via extends through the substrate element at a location proximate to an outer peripheral edge thereof.

7. The substrate of claim 1, wherein the at least one first conductive trace has a width equal to or greater than about 40 μm and is spaced at least about 40 μm from each redistributed bond pad.

8. The substrate of claim 1, wherein:
   the at least one second bond finger is configured for positioning next to at least one bond pad of a semiconductor device mounted to the substrate that supplies power to the semiconductor device or provides an electrical ground for the semiconductor device; and
   the at least one second conductive trace is connected only to a power supply (Vss) or to a ground (Vdd).

9. The substrate of claim 1, wherein:
   the first conductive plane further includes:
      at least one first redistributed bond pad in communication with the at least one first conductive trace; and
      at least one second redistributed bond pad;
   and further comprising:
   another conductive via extending from the at least one second conductive trace and through the substrate element to communicate with the at least one second redistributed bond pad.

10. The substrate of claim 9, wherein the another conductive via extends through the at least one second redistributed bond pad.

11. The substrate of claim 9, wherein:
   the first conductive plane further includes at least one partial, second conductive trace extending laterally to the at least one second redistributed bond pad; and
   the another conductive via extends through the at least one partial, second conductive trace.

12. A semiconductor device package, comprising:
a semiconductor device including a plurality of bond pads on a bond pad-bearing surface;
a redistribution element secured to the bond-pad bearing surface and comprising:
   a substrate comprising at least one peripheral edge located adjacent to the plurality of bond pads, with the plurality of bond pads being exposed laterally beyond the at least one peripheral edge;
   a first conductive plane carried on one surface of the substrate and comprising:
      at least one first bond finger adjacent to the at least one peripheral edge and positioned proximate to a first corresponding bond pad of the plurality of bond pads;
      at least one second bond finger adjacent to the at least one peripheral edge and positioned proximate to a second corresponding bond pad of the plurality of bond pads; and
      at least one first conductive trace continuous with the at least one first bond finger;
   a second conductive plane carried on another, opposite surface of the substrate and comprising:
      at least one second conductive trace; and
      at least one conductive via extending through and communicating with the at least one second bond finger, extending through the substrate, and contacting the at least one second conductive trace; and
   a plurality of intermediate conductive elements, comprising:
      at least one first intermediate conductive element extending between and electrically connecting the at least one first bond finger and the first corresponding bond pad of the plurality of bond pads; and
      at least one second intermediate conductive element extending between and electrically connecting the at least one second bond finger and the second corresponding bond pad of the plurality of bond pads.

13. The semiconductor device package of claim 12, wherein the substrate comprises a chip-scale substrate.

14. The semiconductor device package of claim 12, wherein the at least one peripheral edge comprises an interior peripheral edge defining an aperture through the substrate, through which each of the plurality of bond pads of the semiconductor device is exposed.

15. A redistribution element for use in a chip-scale package, comprising:
a substrate;
a first conductive plane on a first surface of the substrate and comprising:
   a plurality of first connection pads;
   a plurality of first redistribution pads, each first redistribution pad corresponding to a first connection pad of the plurality of first connection pads;
   a conductive trace extending between each first connection pad and the corresponding first redistribution pad;
   a plurality of second connection pads; and
   a plurality of second redistribution pads, each second redistribution pad corresponding to a second connection pad of the plurality of second connection pads;
a second conductive plane on a second surface of the substrate, spaced apart from the first conductive plane by a thickness of the substrate, and comprising:
   a plurality of second conductive traces; and at least two conductive vias associated with each second conductive trace of the plurality of second conductive traces, comprising:
- a first conductive via extending through a corresponding first connective pad and through the thickness of the substrate to the second conductive trace; and
- a second conductive via that extends from the second conductive trace, through the substrate, to a corresponding second redistribution pad or a conductive trace extending laterally therefrom.

16. The redistribution element of claim 15, wherein only a single conductive trace extends between each adjacent pair of redistribution pads of the first conductive plane.

17. The redistribution element of claim 16, wherein the single conductive trace has a width of about 40 μm or more and is spaced at least about 40 μm apart from each adjacent pair of redistribution pads.

* * * * *